United States Patent
Kang

(10) Patent No.: US 10,247,376 B2
(45) Date of Patent: Apr. 2, 2019

(54) LIGHT SOURCE MODULE AND VEHICLE HEADLAMP USING THE SAME

(71) Applicant: Hyundai Motor Company, Seoul (KR)

(72) Inventor: Chan Hee Kang, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 15/201,795

(22) Filed: Jul. 5, 2016

(65) Prior Publication Data
US 2017/0167686 A1 Jun. 15, 2017

(30) Foreign Application Priority Data
Dec. 15, 2015 (KR) .................. 10-2015-0179145

(51) Int. Cl.
| | |
|---|---|
| *F21S 41/00* | (2018.01) |
| *F21S 41/125* | (2018.01) |
| *H01L 25/00* | (2006.01) |
| *F21S 43/19* | (2018.01) |
| *F21S 43/13* | (2018.01) |
| *F21S 43/14* | (2018.01) |
| *F21S 43/15* | (2018.01) |
| *F21S 43/50* | (2018.01) |
| *F21K 9/64* | (2016.01) |

(Continued)

(52) U.S. Cl.
CPC ............. *F21S 41/125* (2018.01); *F21S 43/13* (2018.01); *F21S 43/14* (2018.01); *F21S 43/15* (2018.01); *F21S 43/19* (2018.01); *F21S 43/50* (2018.01); *H01L 25/00* (2013.01); *B60Q 2400/20* (2013.01); *F21K 9/64* (2016.08); *F21S 43/26* (2018.01); *F21S 43/30* (2018.01); *F21S 45/47* (2018.01); *F21Y 2113/13* (2016.08); *F21Y 2115/10* (2016.08)

(58) Field of Classification Search
None
See application file for complete search history.

(56) References Cited

U.S. PATENT DOCUMENTS

| | | | |
|---|---|---|---|
| 2010/0096977 A1* | 4/2010 | Lee ........................... | F21K 9/00 313/503 |
| 2012/0162979 A1* | 6/2012 | Ng ...................... | H01L 25/0753 362/231 |

(Continued)

FOREIGN PATENT DOCUMENTS

| | | |
|---|---|---|
| KR | 100658700 B1 | 12/2006 |
| KR | 10-2009-0001104 A | 1/2009 |

(Continued)

*Primary Examiner* — Ashok Patel
(74) *Attorney, Agent, or Firm* — Mintz Levin Cohn Ferris Glovsky and Popeo, P.C.; Peter F. Corless

(57) ABSTRACT

A light source module and a vehicle headlamp is provided. The light source module and the vehicle headlamp include a circuit board and first and second light emitting modules that are disposed on the circuit board. The first and second light emitting modules are divided by a partition wall. Each of the first and second light emitting modules includes a blue LED light source and a phosphor that is disposed on the blue LED light source. The phosphor is configured to be activated by the blue LED light source to emit first light and includes a phosphor film that is disposed on an exterior of the first light emitting module and the phosphor film is configured to emit a second light.

8 Claims, 2 Drawing Sheets

(51) Int. Cl.
*F21Y 115/10* (2016.01)
*F21Y 113/13* (2016.01)
*F21S 43/20* (2018.01)
*F21S 43/30* (2018.01)
*F21S 45/47* (2018.01)

(56) References Cited

U.S. PATENT DOCUMENTS

| | | | | |
|---|---|---|---|---|
| 2013/0334559 | A1* | 12/2013 | Vdovin | H01L 33/507 |
| | | | | 257/98 |
| 2014/0300267 | A1* | 10/2014 | Oh | H01L 33/60 |
| | | | | 313/46 |
| 2015/0228869 | A1* | 8/2015 | Yoo | H01L 33/54 |
| | | | | 362/97.3 |
| 2016/0161067 | A1* | 6/2016 | Oepts | F21V 9/16 |
| | | | | 362/84 |

FOREIGN PATENT DOCUMENTS

| | | |
|---|---|---|
| KR | 10-0924912 B1 | 11/2009 |
| KR | 2010-0118843 A | 11/2010 |
| KR | 2011-0078482 A | 7/2011 |
| KR | 10-2011-0108147 A | 10/2011 |
| KR | 20-0469056 Y1 | 9/2013 |

* cited by examiner

LIGHT SOURCE MODULE AND VEHICLE HEADLAMP USING THE SAME

CROSS-REFERENCE TO RELATED APPLICATION

This application claims priority to and the benefit of Korean Patent Application No. 10-2015-0179145 filed in the Korean Intellectual Property Office on Dec. 15, 2015, the entire contents of which are incorporated herein by reference.

BACKGROUND

(a) Field of the Invention

The present invention relates to a light source module and a vehicle headlamp using the same.

(b) Description of the Related Art

Generally, a vehicle includes various lamps that allow a driver to recognize objects around the vehicle while driving during low light conditions (e.g., at night) and allow drivers of other vehicles or pedestrians to recognize a driving state of the vehicle. Currently, a light emitting diode (LED) is increasingly used as a light source for a lamp.

However, in current light source module packages, a light source of each of a plurality of packages operates based on particular conditions. Accordingly, a substantial number of packages are manufactured based on the number of wavelengths and result in increased costs. In addition, design for arranging the packages in a limited space is difficult, and additional components for ensuring performance of the design are required.

The above information disclosed in this section is merely for enhancement of understanding of the background of the invention and therefore it may contain information that does not form the prior art that is already known in this country to a person of ordinary skill in the art.

SUMMARY

The present invention provides a light source module and a vehicle headlamp using the same. In an exemplary embodiment a light source module may include a circuit board and first and second light emitting modules disposed on the circuit board. The first and second light emitting modules may be divided by a partition wall. In particular, each of the first and second light emitting modules may include a blue LED light source and a phosphor disposed on the blue LED light source. The phosphor may be configured to be activated by the blue LED light source to emit first light. The first light emitting module may include a phosphor film positioned on the exterior of the first light emitting module. The phosphor film may be configured to emit a second light. The first light and the second light may have different wavelengths.

A dominant wavelength of the first light may be equal to or greater than about 540 nm and equal to or less than about 560 nm. A dominant wavelength of the second light may be equal to or greater than about 585 nm and equal to or less than about 595 nm. A dominant wavelength of the blue LED light source may be equal to or greater than about 440 nm and equal to or less than about 460 nm. The first light may be white light and the second light may be amber light. The first and second light emitting modules may be configured to operate separately. The phosphor may be formed from a silicone material. The phosphor film may be formed from a silicone material.

Additionally, 4.5 wt % or greater and 6 wt % or less of the phosphor having a peak wavelength range of 600 nm or more and 630 nm or less, and 94 wt % or more and 95.5 wt % or less of the silicone, based on 100 wt % of the phosphor film, may be included in the phosphor film. The partition wall may be configured to prevent overlap of the colors between the first light source module and the second light and may be a reflector.

Another exemplary embodiment provides a vehicle headlamp that may include a light source module disposed at a central portion of an aspheric lens. The light source module may include a circuit board and first and second light emitting modules may be disposed on the circuit board. The first and second light emitting modules may be separated by a partition wall. In particular, each of the first and second light emitting modules may include a blue LED light source and a phosphor disposed on the blue LED light source. The phosphor may be activated by the blue LED light source to emit first light. The first light emitting module may include a phosphor film disposed at the exterior of the first light emitting module. The phosphor film may be configured to emit a second light. The wavelengths of first light and the second light may vary. The vehicle headlamp may include a heatsink disposed at a rear surface of the light source module. A plurality of different types of light may be positioned at the central portion of the aspheric lens of the vehicle headlamp.

A dominant wavelength of the first light may be equal to or greater than about 540 nm and equal to or less than about 560 nm. A dominant wavelength of the second light may be equal to or greater than about 585 nm and equal to or less than about 595 nm. A dominant wavelength of the blue LED light source may be equal to or greater than about 440 nm and equal to or less than about 460 nm. In particular, a dominant wavelength of the blue LED light source may be equal to or greater than about 440 nm and equal to or less than about 460 nm.

The first light may be white light and the second light may be amber light. The first and second light emitting modules may be operated separately. The phosphor may be formed from a silicone material. The phosphor film may be formed from a silicone material. Furthermore, 4.5 wt % or more and 6 wt % or less of the phosphor may have a peak wavelength range of 600 nm or more and 630 nm or less, and 94 wt % or more and 95.5 wt % or less of the silicone, based on 100 wt % of the phosphor film, may be included in the phosphor film.

The partition wall may be configured to separate colors between the first light source module and the second light source module and may be a reflector. The light source module and the vehicle headlamp using the same may be provided.

BRIEF DESCRIPTION OF THE DRAWINGS

The above and other objects, features and advantages of the present invention will be more clearly understood from the following detailed description when taken in conjunction with the accompanying drawings, in which.

DETAILED DESCRIPTION

Figure 1:
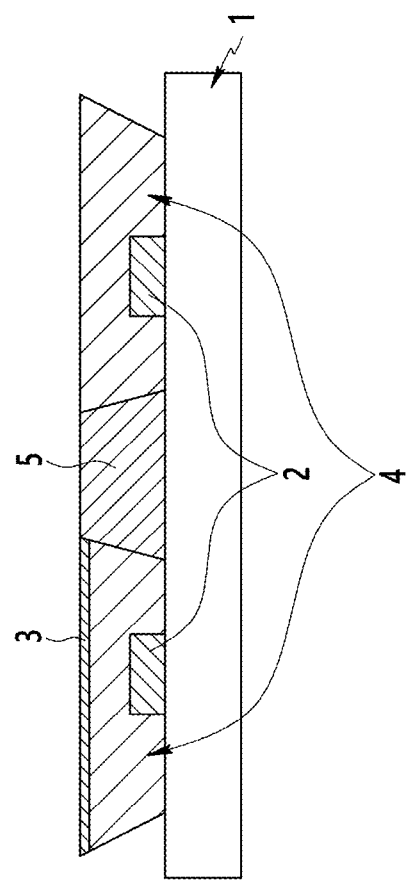
FIG. 1 illustrates an exemplary schematic view of a light source module according to an exemplary embodiment of the present disclosure.

The present disclosure will be described more fully hereinafter with reference to the accompanying drawings, in which exemplary embodiments of the disclosure are shown. However, it is to be understood that the disclosure is not limited to the disclosed embodiments, but, on the contrary, is intended to cover various modifications. As those skilled in the art would realize, the described exemplary embodiments may be modified in various different ways, all without departing from the spirit or scope of the present disclosure. On the contrary, the invention is intended to cover not only the exemplary embodiments, but also various alternatives, modifications, equivalents and other embodiments, which may be included within the spirit and scope of the invention as defined by the appended claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Currently, light source module packages for vehicle headlamps include a light source of each of a plurality of packages that operate based on conditions. Accordingly, a substantial number of the packages are manufactured based on the required number of wavelengths which increases the manufacturing costs. Additionally, designs that arrange the packages in a limited space are difficult to achieve and additional components that ensure the performance of the design are required.

An exemplary embodiment for solving the above problem provides a light source module that may generate a plurality of wavelengths with a single package without a plurality of light source module packages. Additionally, an exemplary embodiment provides a light source module that may be configured to separately operate light sources with a plurality of wavelengths to improve the driving convenience and safety by the operation of the light source at each wavelength based on the driving conditions.

FIG. 1 illustrates an exemplary schematic view of a light source module 100 according to an exemplary embodiment of the present disclosure. In particular, a light source module 100 may include a circuit board 1 and first and second light emitting modules disposed on the circuit board. The first and second light emitting modules may be separated by a partition wall 5. Each of the first and second light emitting modules may include a blue LED light source 2 and a phosphor 4 positioned on the blue LED light source 2. The phosphor 4 may be activated excited by the blue LED light source configured to emit first light. The first light emitting module may include a phosphor film 3 disposed at the exterior of the first light emitting module. The phosphor film 3 may be configured to emit the second light. The wavelength of first light and the second may vary.

The circuit board may be a printed circuit board (PCB). A dominant wavelength of the blue LED light source may be equal to or greater than about 440 nm and equal to or less than about 460 nm. Further, a dominant wavelength of the phosphor may be equal to or greater than about 540 nm and equal to or less than about 630 nm.

The first light may be white light. The blue LED light source having the dominant wavelength of the range described above may be configured to emit light that may change to white light while passing through a phosphor with a peak wavelength of the above-described range and may be emitted from the phosphor. A dominant wavelength of the first light may be equal to or greater than about 540 nm and equal to or less than about 560 nm. The first light emitting module may include the phosphor film disposed at the exterior thereof, thus white light may be changed to another color light as the white light passes through the phosphor film and may be emitted from the phosphor film.

The second light may be amber light. For example, the amber light may originate as the white light emitted from the blue LED light source and the phosphor as described above. In particular, the white light may be changed to amber light while passing through the phosphor film positioned at the exterior of the first light emitting module and the light emitting module may be configured to emit the amber light. The amber light may correspond to light with a wavelength equal to or greater than about 585 nm and equal to or less than about 595 nm. However, the second light may not be limited to the amber light, and may be changed to another color light by replacement (e.g., substitution) of the phosphor film.

The phosphor and the phosphor film may be formed from a silicone material. For example, 4.5 wt % or greater and 6 wt % or less of the phosphor may have a peak wavelength range of 600 nm or greater and 630 nm or less. Further, 94 wt % or greater and 95.5 wt % or less of the silicone, based on 100 wt % of the phosphor film, may be included in the phosphor film. The first light may be converted into the second light, in other words, the amber light, by the phosphor film with the above-described contents of phosphor applied thereto. Alternately, the first light may be converted into a different color light by an adjustment to the contents of the phosphor.

The partition wall may separate colors between the first light source module and the second light source module and may be a reflector. Accordingly, a plurality of different types of light may be separated (e.g., prevented from overlap), and may be emitted to maintain the separate colors. Further, since the partition wall may be a reflector, the efficiently of the light extraction may be improved.

The first and second light emitting modules may be configured to operate separately or simultaneously based on the arrangement of the electrodes. For example, separate operation of the respective light emitting modules, may include positive (+) electrodes or negative (−) electrodes arranged to be commonly used. The remaining electrodes may be connected to the respective light sources and the light emitting control may be performed separately based on the electrical signals of a system.

Figure 2:
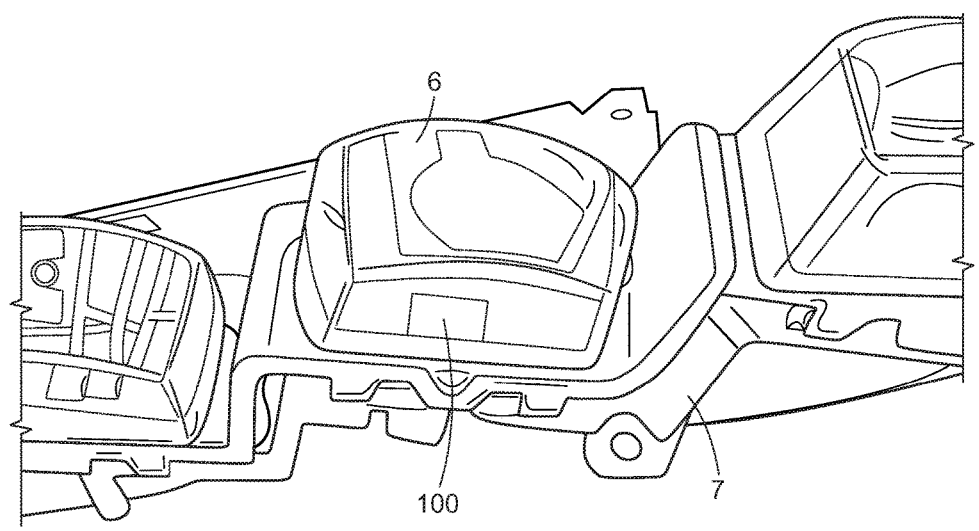
FIG. 2 illustrates an exemplary photograph of a vehicle headlamp according to an exemplary embodiment of the present disclosure.

FIG. 2 illustrates an exemplary photograph of a vehicle headlamp according to an exemplary embodiment of the present disclosure. A vehicle headlamp according to another exemplary embodiment of the present disclosure may include a light source module 100 positioned at a central portion of an aspheric lens 6. The light source module 100 may include a circuit board 1 and first and second light emitting modules may be positioned on the circuit board. The first and second light emitting modules may be separated by a partition wall 5. Each of the first and second light emitting modules may include a blue LED light source 2 and a phosphor 4 disposed on the blue LED light source 2. The phosphor 4 may be configured to be activated by the blue LED light source to emit first light. The first light emitting module may include a phosphor film 3 positioned at the exterior of the first light emitting module. The phosphor film 3 may be configured to emit a second light. The wavelengths of the first light and the second light may vary. The circuit board may be a PCB.

To improve the light efficiency and design a light distribution structure for the light source module may be positioned at a lower side of the central portion of the aspheric lens. When the white LED light source and the amber LED light source are used together in the prior art, the light of the light source module may be positioned at the central portion of the aspheric lens by respectively using the white LED light source and the amber LED light source. However, according to the exemplary embodiment of the present disclosure, a plurality of different types of light may be positioned at the central portion of the aspheric lens.

Further, according to the exemplary embodiment, since the blue LED provides about 1.5 times greater luminosity than the amber LED, the amber LED is merely used as the light source and performance of the lamp may be maximized. When the blue LED light source and the phosphor film are configured to activate a turn signal lamp, less power may be utilized than when the amber LED was used. Further, fuel consumption may be improved by a reduction of the power consumption of the vehicle. In the related art, the headlamp is complicatedly and densely designed to include various functional lighting components. Conversely, when the single package type of light source module of exemplary embodiment is used, the number of light source modules may be reduced from two to one. Thus, an area occupied by components of a lighting apparatus may be reduced and a small interior space of the headlamp may be efficiently utilized and the design of the lamp may be improved.

The vehicle headlamp may include a heatsink 7 positioned at a rear surface of the light source module. The heatsink may maintain the temperature of the light source at a predetermined temperature to consistently maintain the performance of the light source. The light source module may be coupled to a front surface of the heatsink and a rear portion of the heatsink may be coupled to a fixing portion of the vehicle.

A dominant wavelength of the blue LED light source may be equal to or greater than about 440 nm and equal to or less than about 460 nm. A dominant wavelength of the phosphor may be equal to or greater than about 540 nm and equal to or less than about 630 nm. The first light may be white light and light emitted from the blue LED light source having the dominant wavelength of the range described above may be changed to white light while passing through a phosphor having a peak wavelength of the above-described range. After the light passes through the phosphor, the light may be emitted. A dominant wavelength of the first light may be equal to or greater than about 540 nm and equal to or less than about 560 nm.

The first light emitting module may include the phosphor film positioned at the exterior thereof. Accordingly, white light may be changed to a different color light while the white light passes through the phosphor film and may be emitted. The second light may be amber light. The amber light may be the white light emitted from the blue LED light source and the phosphor as described above may be changed the white light to amber light when the light passes through the phosphor film positioned at the exterior of the first light emitting module. The amber light may be emitted from the phosphor film. The amber light may correspond to light that has a wavelength equal to or greater than about 585 nm and equal to or less than about 595 nm. However, the second light is not limited to the amber light, and may be changed to an alternate color light by replacement of the phosphor film.

The phosphor and the phosphor film may be formed from a silicone material, and 4.5 wt % or greater and 6 wt % or less of the phosphor having a peak wavelength range of 600 nm or more and 630 nm or less. Further, 94 wt % or greater and 95.5 wt % or less of the silicone, based on 100 wt % of the phosphor film, may be included in the phosphor film. The first light may be converted into the second light in other words, to the amber light emitted by the phosphor film to which the above-described contents of phosphor may be applied. In particular, the first light may be converted into an alternative color light via adjustment of the contents of the phosphor.

The partition wall may provide a separation between the colors of the first light source module and the second light source module. In other words, the partition wall may prevent the colors of the first light source module and the second light source module from overlapping with each other and may be a reflector. Accordingly, multiple different types of light may be separated and may be configured to be emitted while each type of light maintains their individual colors. Further, since the partition wall may reflect the light, light-extracting efficiency may be improved.

The first and second light emitting modules may be configured to operate separately or simultaneously based on the arrangement of the electrodes. For separate operation of the respective light emitting modules, the positive (+) electrodes or the negative (−) electrodes thereof may be arranged to be commonly used. The remaining electrodes may be connected to the respective light sources, and may be configured to separately emit light based on to the electrical signals of the system.

While this invention has been described in connection with what is presently considered to be an exemplary embodiment, it is to be understood that the invention is not limited to the disclosed exemplary embodiments, but, on the contrary, is intended to cover various modifications and equivalent arrangements included within the spirit and scope of the appended claims. Therefore, the exemplary embodiments described above are only examples and should not be construed as being limitative in any respects.

DESCRIPTION OF SYMBOLS

1: circuit board
2: blue LED light source
3: phosphor film
4: phosphor
5: partition wall
6: aspheric lens
7: heatsink
100: light source module

What is claimed is:

1. A light source module, comprising:
a circuit board;
first and second light emitting modules disposed on the circuit board; and
a partition wall that divides the first and second light emitting modules,
wherein each of the first and second light emitting modules includes a blue light emitting diode (LED) light source and a phosphor disposed on the blue LED light source and the phosphor is configured to be activated by the blue LED light source to emit first light,
wherein the first light emitting module includes a phosphor film disposed on an exterior of the first light emitting module, and the phosphor film is configured to emit a second light,
wherein the first light and the second light have different wavelengths,
wherein a dominant wavelength of the first light is equal to or greater than about 540 nm and equal to or less than about 560 nm, and
wherein a dominant wavelength of the second light is equal to or greater than about 585 nm and equal to or less than about 595 nm.

2. The light source module of claim 1, wherein the partition wall is configured to separate colors between the first light source module and the second light source module to prevent overlap, and is operated as a reflector.

3. The light source module of claim 1, wherein a dominant wavelength of the blue LED light source is equal to or greater than about 440 nm and equal to or less than about 460 nm.

4. The light source module of claim 1, wherein the first light is white light and the second light is amber light.

5. The light source module of claim 1, wherein the first and second light emitting modules are configured to operate separately.

6. The light source module of claim 1, wherein the phosphor is formed of a silicone material.

7. The light source module of claim 1, wherein the phosphor film is formed of a silicone material.

8. The light source module of claim 1, wherein
the phosphor includes a 4.5 wt % or greater and 6 wt % or less and a peak wavelength range of 600 nm or greater and 630 nm or less, and the silicone includes 94 wt % or greater and 95.5 wt % or less, based on 100 wt % of the phosphor film, is included in the phosphor film.

* * * * *